United States Patent
Singh

(10) Patent No.: US 6,169,286 B1
(45) Date of Patent: *Jan. 2, 2001

(54) METHOD AND APPARATUS FOR OPERATING A DUAL GATE TFT ELECTROMAGNETIC RADIATION IMAGING DEVICE

(75) Inventor: Surendra Pal Singh, Waterloo (CA)

(73) Assignee: 1294339 Ontario, Inc. (CA)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/000,484
(22) PCT Filed: Jul. 31, 1995
(86) PCT No.: PCT/CA95/00451
    § 371 Date: Jul. 21, 1998
    § 102(e) Date: Jul. 21, 1998
(87) PCT Pub. No.: WO97/05657
    PCT Pub. Date: Feb. 13, 1997

(51) Int. Cl.$^7$ .................................................. H01L 27/146
(52) U.S. Cl. ................................... 250/370.08; 250/208.1
(58) Field of Search .................... 250/370.09, 370.01, 250/370.08, 370.14, 208.1; 257/448

(56) References Cited

U.S. PATENT DOCUMENTS

| | | |
|---|---|---|
| 4,689,487 | 8/1987 | Nishiki et al. . |
| 5,182,624 | 1/1993 | Tran et al. . |
| 5,235,195 | 8/1993 | Tran et al. . |
| 5,396,072 | 3/1995 | Schiebel et al. . |
| 5,436,442 * | 7/1995 | Michon et al. .................. 250/208.1 |

FOREIGN PATENT DOCUMENTS 0 574 690 A2    6/1993   (EP) .

OTHER PUBLICATIONS

L.E. Antonuk et al., "Demonstration of megavoltage and diagnostic x–ray imaging with hydrogenated amorphous silicon arrays", Med. Phys. 19 (6), 1455 (Nov./Dec. 1992).
Z–S. Huang et al., IEEE Transactions on Electronic Devices, ED–37 1432 (1990).
F. Andoh et al., "Proceedings of IEEE International Solid State Circuits Conference", p. 212 (1990).
W. Zhao, "Digital Radiology Using Self–scanned Readout of Amorphous Selenium", SPIE vol. 1896 Physics of Medical Imaging (1993).

* cited by examiner

Primary Examiner—Seungsook Ham
Assistant Examiner—Richard Hanig
(74) Attorney, Agent, or Firm—Fay, Sharpe, Fagan, Minnich & McKee, LLP

(57) ABSTRACT

A method and apparatus of operating a dual gate TFT electromagnetic radiation imaging device wherein the electrical conditions on each pixel are compared after exposure to radiation and during measurement. The pixel charge electrode is preset to a predetermined voltage level prior to radiation exposure so that the pixel may be operated beyond its linear operating range.

9 Claims, 2 Drawing Sheets

METHOD AND APPARATUS FOR OPERATING A DUAL GATE TFT ELECTROMAGNETIC RADIATION IMAGING DEVICE

FIELD OF THE INVENTION

This invention relates in general to electromagnetic radiation imaging devices, and more particularly to a method and apparatus for operating an X-ray imaging device beyond the linear range of each pixel sensor.

BACKGROUND OF THE INVENTION

The use of two-dimensional arrays of thin film transistors for radiation detection is known in the art. One prior art X-ray imaging detector has been developed at the University of Michigan, as described in L. E. Antonuk, J. Boudry, W. Huang, D. L. McShan, E. J. Morton, J. Yorkston, M. J. Longo, and R. A. Street, Multi-Element Amorphous Silicon Detector Array (MASDA), MED PHYS 19, 1455 (1992). In this prior art detector, a scintillating material (e.g. phosphor screen or CsI) converts X-rays directly into light. The light then impinges on an array of a-Si:H photodiodes, which produce charge in proportion to the light intensity. The generated charge is stored on a capacitor and is read out through a thin film transistor (TFT) as each line is addressed.

Another prior art detector has been developed by researchers at the University of Toronto in which X-rays are converted directly to charge. This system is described in W. Zhao and J. S. Rowlands, Selenium Active Matrix Universal Read-out Array Imager (SAMURAI), Medical Imaging VII: Physics of Medical Imaging SPIE (1993). Both the prior art MASDA and SAMURAI devices require measurement of charge (or integrated current), which is proportional to X-ray intensity, for each addressed row of the array.

Instead of directly measuring the charge generated by the radiation, it is known in the art to allow the charge to accumulate on the gate of a field effect transistor and to modulate the current through the channel. This approach takes advantage of the intrinsic amplification function of a field effect transistor and also allows the signal to be measured without necessarily destroying the charge. This prior art approach to radiation detection has been disclosed in U.S. Pat. Nos. 5,182,624 and 5,235,195 (Tran et al).

A modified version of this approach, for video camera use, has also been proposed (see Z-S. Huang and T. Ando, IEEE Transactions on Electronic Devices, ED-37 1432 (1990) and F. Andoh, K. Taketoshi, J. Yamasaki, M. Sugawara, Y. Fujita, K. Mitani, Y. Matuzawa, K. Miyata and S. Araki, Proceedings of IEEE International Solid State Circuits Conference, page 212 (1990)). In this modified version, a three transistor circuit is used at each pixel location. One of the transistors is used for row selection, another is used for modulating the current in proportion to the radiation-induced charge, and third transistor is used to clear the radiation-induced charge when the next row is addressed.

One disadvantage of such prior art systems is that the pixel arrays suffer from sensor non-linearity, thereby requiring extremely accurate photolithography in the fabrication process to ensure inter-pixel matching and reduction of parasitic capacitances. Furthermore, such prior art devices are limited to operating in the linear range of each pixel, thereby limiting the range of detectable radiation-generated charges.

SUMMARY OF THE INVENTION

According to the present invention, a new method and apparatus is provided for driving electromagnetic radiation imaging devices using dual gate thin film transistors. The principal advantage provided by the present invention over the prior art, is the elimination of sensor non-linearity at the pixel level. This advantage is achieved by selecting a range of operation of said pixel which preferably approaches the biasing voltage range, and by duplicating and comparing the pixel during measurement with the electrical conditions of the pixel resulting from exposure to radiation. The pixel charge electrode is preset to a predetermined voltage level prior to radiation exposure so that the pixel may be caused to operate beyond its linear operating range. The imaging device according to the present invention is capable of operating over a wider sensing range since the sensors are not restricted to operation in the linear range. Furthermore, practical implementation of the imager according to the present invention is simplified as a result of more relaxed fabrication design rules over prior art systems, since inter-pixel matching is not required.

The method and apparatus for driving electromagnetic radiation imaging devices according to the present invention, may advantageously be used in the electromagnetic radiation imaging device using dual gate thin film transistors as described and claimed in applicant's international patent application number PCT/CA94/00077, filed Feb. 11, 1994, the contents of which are incorporated herein by reference.

BRIEF DESCRIPTION OF THE DRAWINGS

A detailed description of the preferred embodiment is provided herein below with reference to the sole drawing in which.

DETAILED DESCRIPTION OF THE PREFERRED EMBODIMENT

Figure 1A:
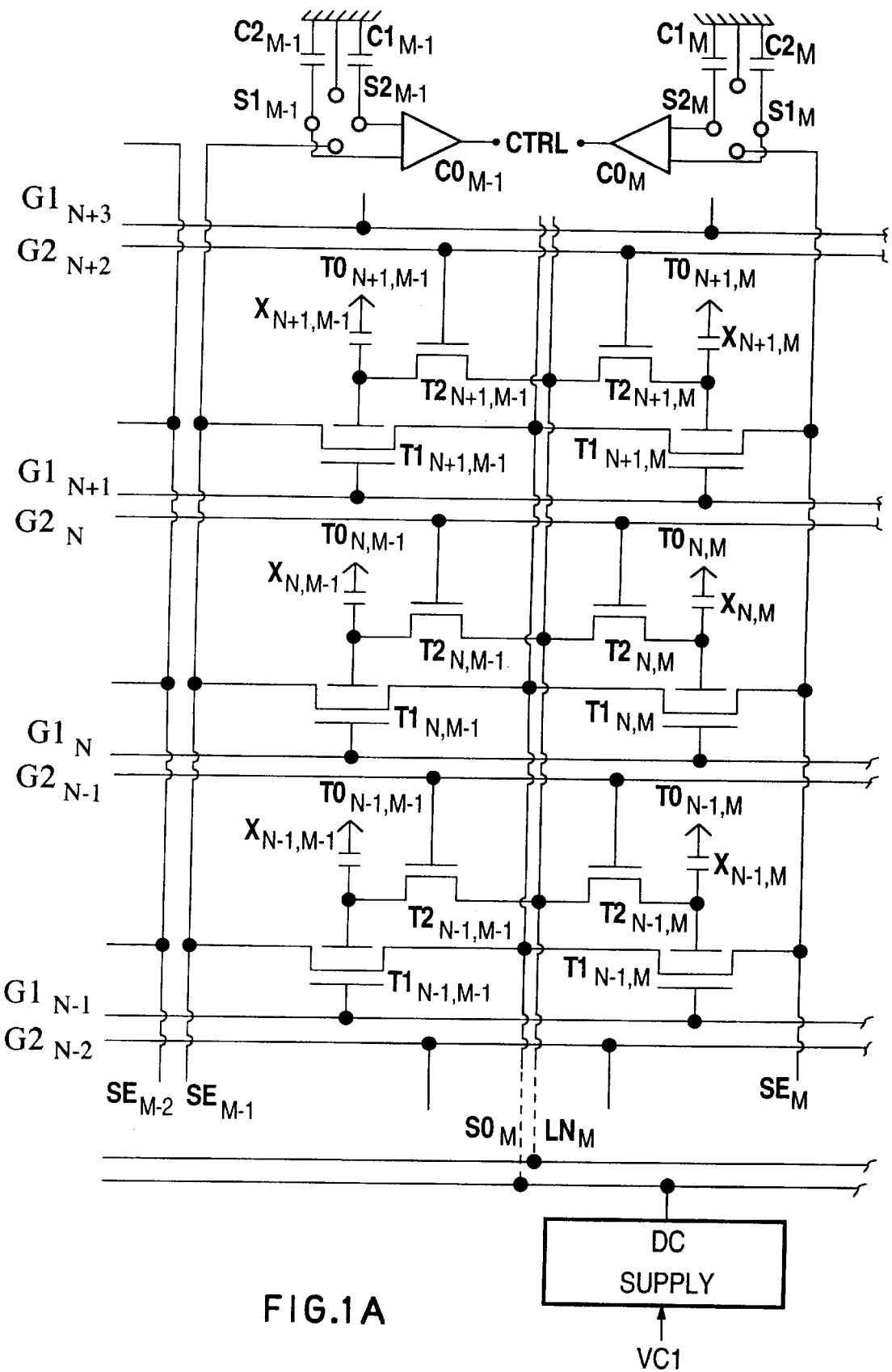
FIG. 1 comprising parts-1A and 1B together, is a block schematic diagram of a parasitic independent, wide dynamic range driver for a dual gate TFT electromagnetic radiation imaging device in accordance with the preferred embodiment.
Figure 1B:
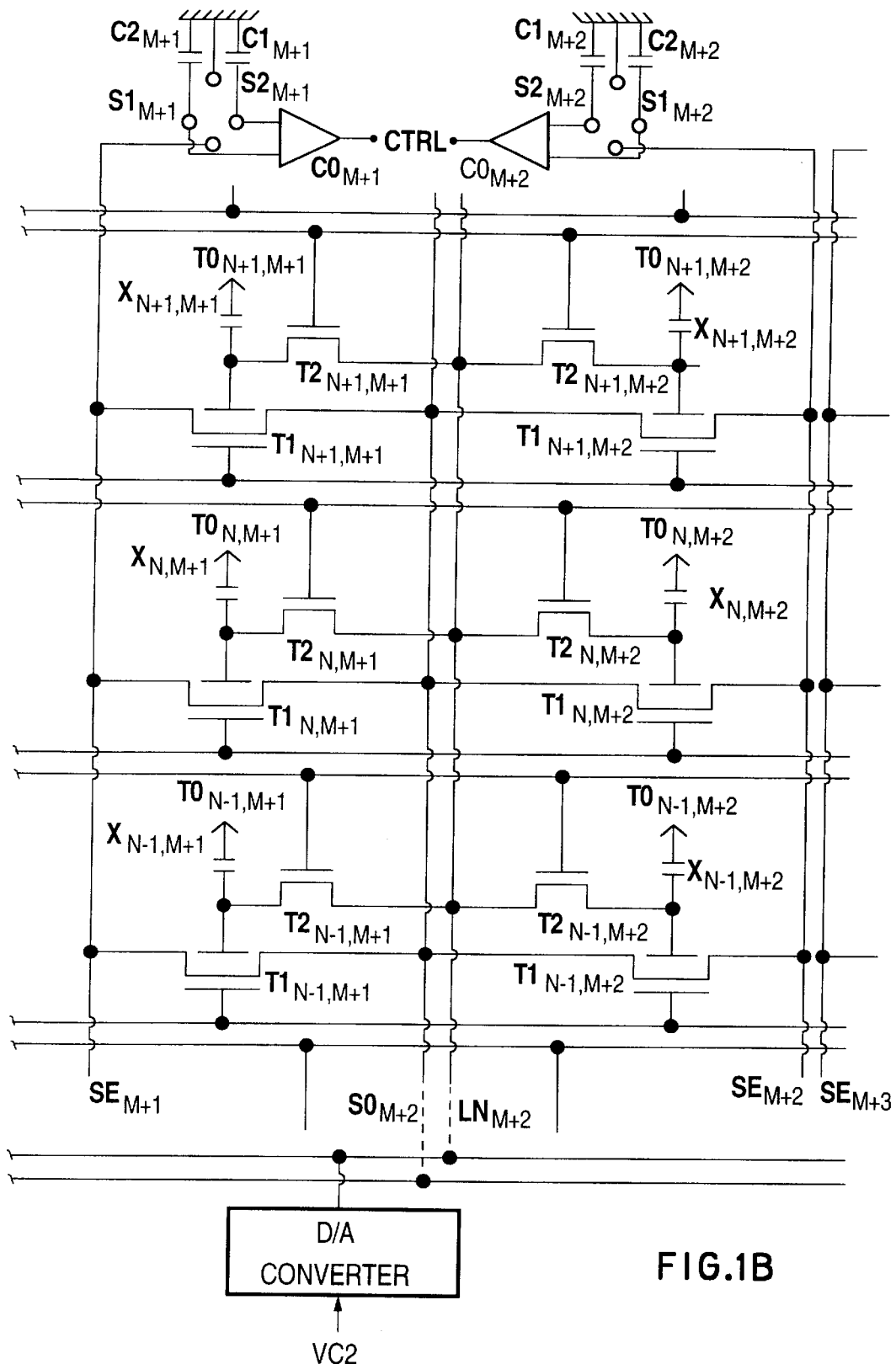

FIG. 1 depicts a 4×3 pixel imaging array in accordance with the present invention. Each pixel comprises a radiation-to-charge transducer, X, having one electrode connected to an independent top contact, T0, and an opposite electrode connected to one gate of a dual gate TFT T1 and to the drain of a further TFT T2. The transducer X can be fabricated from amorphous selenium, or any other suitable material for directly converting electromagnetic radiation into electron-hole pairs. The top contact, T0, for each transducer X can be connected to a common terminal for all transducers, or can be separately connected, depending on the application.

Each pixel is connected to two input source lines. The first source line, S0, receives a DC voltage from DC supply 1, for application to the source of each TFT T1. The DC voltage level is set by a control signal, VC1, applied to the supply 1. The other input source line, LN, receives a controlled variable voltage from digital-to-analog (D/A) converter 3, for application to the source of each TFT T2. The DC voltage output from D/A converter 3 is set by a digital input value VC2.

A single output sense line, SE, is provided for each column of pixels. The drain of each TFT T1 is connected to an associated output sense line SE, which is further connected to an associated comparator C0.

Thus, as will be seen from FIG. 1, the two input source lines (S0 and LN) are shared between two consecutive row pixels while the sense line (SE) is independent.

Each pixel is controlled by two gate lines (G1 and G2), for independent switching of TFTs T1 and T2, as well as simultaneous connections of the TFTs T1 and T2 to the different voltage sources (i.e DC supply 1 and D/A converter 3).

Each sense line SE is connected to one of a pair of identical capacitors C1 and C2, depending on the position of switches S1 and S2. The capacitors C1 and C2 can also be connected to ground and to respective inputs of the associated comparator C0, via the switches S1 and S2. Thus, the switches S1 and S2 are operated to selectively ground capacitors C1 and C2, to connect sense line SE to one of capacitors C1 and C2, and to connect the capacitors C1 and C2 to the respective inputs of the comparator C0.

In operation, the top gate electrode of TFT T1 is first set to a predetermined voltage V1, where V1 can be zero volts or any other predetermined value. In order to preset this top electrode voltage, D/A converter 3 generates the required voltage V1, an enable voltage is applied to the gate lines G2 for enabling TFTs T2, and the top contact T0 of each charge transducer X is grounded.

According to this operation, a predetermined sensor range is selected for operating the TFTs T1 (which, as discussed above, the extended operating range can be outside of the normal linear pixel operating range which is generally significantly smaller than the TFT biasing voltage range (typically ½ or less). The extended operating range provided by the driving scheme of the present invention preferably approaches the biasing voltage range.

Next, the TFT array is exposed to radiation (e.g. X-rays), so that electron-hole pairs are generated in the charge transducers X. During radiation exposure, the top contact TO is normally connected to a high voltage source, but can be connected to an alternate suitable voltage source in the event that a non-zero voltage V1 has been applied to the top gate TFTs T1.

Finally, the charge acquired by the top electrodes of the T1 TFTs is measured on a row-by-row basis, as follows.

Firstly, the C1 and C2 capacitors are discharged to ground via respective switches S1 and S2. Next, the DC supply 1 is caused to generate a predetermined voltage V2. The voltage V2 depends on the TFT technology employed. The gate lines GI of the selected row are enabled, and the C1 capacitors are switched to the corresponding sense lines SE for a-predetermined duration so that the charge on the top electrodes of the T1 TFTs (i.e. charge proportional to that on the pixels), is stored on the respective capacitors C1. Next, the second gate line G2 for the selected row is enabled.

Finally, the output voltage from D/A converter 3 is successively incremented from a minimum level, and, for each successive output voltage from D/A converter 3, a series of operations are performed for each source line, as follows:

A) Connect the capacitors C2 to the sense lines SE for a predetermined duration similar to that discussed above with reference to capacitors C1.

B) Compare the charges on the respective capacitors C1 and C2, via the associated comparators C0.

C) If the voltage on a capacitor C2 is more than that at the respective capacitor C1, go to step G for that particular column.

D) Discharge capacitors C2 (except those for which process control has branched to step G).

E) Increment the output of D/A converter 3 (i.e. by incrementing the digital input thereto).

F) Go to step A.

G) Read the digital input value to D/A converter 3, which indicates the amount charge present on a particular pixel.

H) Continue the steps A–H until charges on all pixel rows have been detected.

In summary, the method and apparatus of the present invention effectively eliminates the effects of charge leakage, parasitic capacitances and sensor non-linearity at the pixel level, resulting in simplified fabrication of radiation imaging devices which utilize dual gate TFT arrays, and a wider pixel sensing range.

A person understanding the present invention may conceive of other embodiments or variations therein, without departing from the sphere and scope as provided by the claims appended hereto.

I claim:

1. An electromagnetic radiation imaging sensor, comprising:
   a) a first and a second control line;
   b) a first and a second input source line;
   c) an output sense line;
   d) a transducer for converting charge to radiation, said transducer having first and second contacts, said first contact being connected to a source of bias voltage;
   e) a first transistor device having a first control input connected to said first control line, a second control input connected to said second contact of said transducer, a first signal terminal connected to said first input source line, and a second signal terminal connected to said output sense line;
   f) a second transistor having a control input connected to said second control line, a first signal terminal connected to said second input source line, and a second signal terminal connected to the second control input of said first transistor;
   g) a source of constant voltage connected to said first input source line;
   h) a source of controlled variable voltage connected to said second input source line;
   i) a first capacitor switchable between ground and said output sense line;
   j) a second capacitor switchable between ground and said output sense line; and
   k) a comparator having first and second inputs connected to said first and second capacitors, respectively, and an output.

2. The sensor of claim 1, wherein said first and second transistors are thin film transistors.

3. The sensor of claim 1, wherein said a source of constant voltage is a DC supply circuit.

4. The sensor of claim 1, wherein said source of controlled variable voltage is a digital-to-analog converter.

5. A method of operating the electromagnetic imaging sensor of claim 1, comprising the steps of:
   i) generating a first predetermined voltage via said source of controlled variable voltage;
   ii) presetting said second control input to said predetermined voltage;
   iii) exposing said transducer to radiation;
   iv) discharging said first and second capacitor;
   v) enabling said first transistor and connecting said first capacitor to said output sense line, thereby storing a voltage on said first capacitor which is representative of said radiation;

vi) generating a succession of further predetermined voltages via said source of controlled variable voltage, each in said succession of further voltages being greater than a prior one in said succession;

vii) successively storing said succession of further voltages on said second capacitor; and viii) for each of said further voltages monitoring said output of said comparator and discharging said second capacitor until said output indicates that the voltage on said second capacitor is greater than the voltage on said first capacitor, thereby indicating that the voltage generated by said source of controlled variable voltage corresponds to charge on said transducer.

6. The method of claim 5, wherein said step of presetting said second control input to said predetermined voltage further comprises the steps of applying an enable voltage to said second control line for enabling said first transistor and thereby apply said predetermined voltage from said second input source line to said second control input, and grounding said first contact of said transducer.

7. The method of claim 5, wherein said step of enabling said first transistor further comprises the steps of discharging said first and second capacitors and applying an enable signal to said first control line.

8. The method of claim 5, wherein said steps of generating said succession of further predetermined voltages, storing said succession of further predetermined voltages on said second capacitor and monitoring said output of said comparator further comprises the steps of:

A) connecting said second capacitor to said output sense line;

B) comparing voltages on respective ones of said first and second capacitors;

C) if the voltage on said first capacitor is greater than or equal to the voltage on said second capacitor then discharging said second capacitor, incrementing said further predetermined voltage, and returning to step A); and D) if the voltage on said second capacitor is greater than the voltage on said first capacitor then identifying said further predetermined voltage as equivalent to the charge on said transducer.

9. A method of operating the electromagnetic radiation imaging sensor of claim 3, comprising the steps of:

i) generating a first predetermined voltage via said source of controlled variable voltage;

ii) applying an enable voltage to said second control line;

iii) grounding said first contact of said transducer;

iv) exposing said transducer to radiation;

v) discharging said first and second capacitors;

vi) applying an enable signal to said first control line;

vii) connecting said first capacitor to said output sense line, thereby storing a voltage on said first capacitor which is proportional to said radiation;

viii) applying an enable voltage to said second control line;

ix) resetting said source of controlled variable voltage to a minimum voltage; and x) in succession A) connecting said second capacitor to said output sense line;

B) comparing voltages on respective ones of said first and second capacitors;

C) if the voltage on said first capacitor is greater than or equal to the voltage on said second capacitor then discharging said second capacitor, incrementing said further predetermined voltage, and returning to step A);

D) if the voltage on said second capacitor is greater than the voltage on said first capacitor then identifying said further predetermined voltage as equivalent to the charge on said transducer.

* * * * *